(12) United States Patent
Yamamoto (10) Patent No.: US 7,531,788 B2
(45) Date of Patent: May 12, 2009

(54) PHOTOSENSOR COMPRISING LIGHT RECEIVING ELEMENTS AND FILTERS, AND A CORRESPONDING TARGET DETECTION METHOD AND DISPLAY PANEL

(75) Inventor: Takumi Yamamoto, Hino (JP)

(73) Assignee: Casio Computer Co., Ltd., Tokyo (JP)

( * ) Notice: Subject to any disclaimer, the term of this patent is extended or adjusted under 35 U.S.C. 154(b) by 0 days.

(21) Appl. No.: 11/974,629

(22) Filed: Oct. 15, 2007

(65) Prior Publication Data

US 2008/0087803 A1    Apr. 17, 2008

(30) Foreign Application Priority Data

Oct. 16, 2006    (JP)    ............... 2006-281782

(51) Int. Cl.
*G06F 3/042*    (2006.01)

(52) U.S. Cl. .................. 250/221; 250/226; 345/175

(58) Field of Classification Search .......... 250/221, 250/222.1, 226, 214.1, 214 R, 208.1; 345/156, 345/173, 175; 340/407.1, 407.2; 382/124, 382/312; 348/266, 272, 273, 294

See application file for complete search history.

(56) References Cited

U.S. PATENT DOCUMENTS

| | | | |
|---|---|---|---|
| 6,108,461 A | 8/2000 | Haga | |
| 2002/0030768 A1 | 3/2002 | Wu | |
| 2004/0263069 A1 | 12/2004 | Yamazaki et al. | |
| 2005/0161675 A1 | 7/2005 | Kimura | |
| 2005/0270590 A1 | 12/2005 | Izumi et al. | |
| 2007/0108454 A1 | 5/2007 | Yamazaki et al. | |
| 2008/0122792 A1* | 5/2008 | Izadi et al. | ................. 345/173 |
| 2008/0122803 A1* | 5/2008 | Izadi et al. | ................. 345/175 |

FOREIGN PATENT DOCUMENTS

| | | |
|---|---|---|
| JP | 6-236980 | 8/1994 |
| JP | 2002-148353 A | 5/2002 |
| WO | WO 2004/039059 A1 | 5/2004 |

OTHER PUBLICATIONS

Notification of Transmittal of the International Search Report and the Written Opinion of the International Searching Authority dated Feb. 1, 2008 for PCT/JP2007/070036. 18 sheets.

* cited by examiner

*Primary Examiner*—Kevin Pyo
(74) *Attorney, Agent, or Firm*—Frishauf, Holtz, Goodman & Chick, P.C.

(57) ABSTRACT

A photosensor includes first and second light receiving elements which detect light, and a light source which is disposed behind the first and second light receiving elements and which emits light containing a predetermined color component. A first filter is disposed in front of the first light receiving element and transmits light of the predetermined color component, and a second filter is disposed in front of the second light receiving element and shuts off the light of the predetermined color component and transmits a color component other than the predetermined color component. A judging section judges whether or not a detection target is present in front of the first and second filters in accordance with outputs from the first and second light receiving elements.

23 Claims, 5 Drawing Sheets

PHOTOSENSOR COMPRISING LIGHT RECEIVING ELEMENTS AND FILTERS, AND A CORRESPONDING TARGET DETECTION METHOD AND DISPLAY PANEL

CROSS-REFERENCE TO RELATED APPLICATIONS

This application is based upon and claims the benefit of priority from prior Japanese Patent Application No. 2006-281782, filed Oct. 16, 2006, the entire contents of which are incorporated herein by reference.

BACKGROUND OF THE INVENTION

1. Field of the Invention

The present invention relates to a photosensor for detecting light, a target detection method of the photosensor, and a display panel equipped with the photosensor.

2. Description of the Related Art

As disclosed in, for example, Jpn. Pat. Appln. KOKAI Publication No. 6-236980, there has hitherto been known a photosensor constituted of a plurality of adjacently arranged light receiving elements formed from amorphous silicon (hereinafter referred to as a-Si) as thin-film transistors (hereinafter referred to as a-Si TFTs), which produce electrical energy corresponding to irradiated light.

Figure 7:
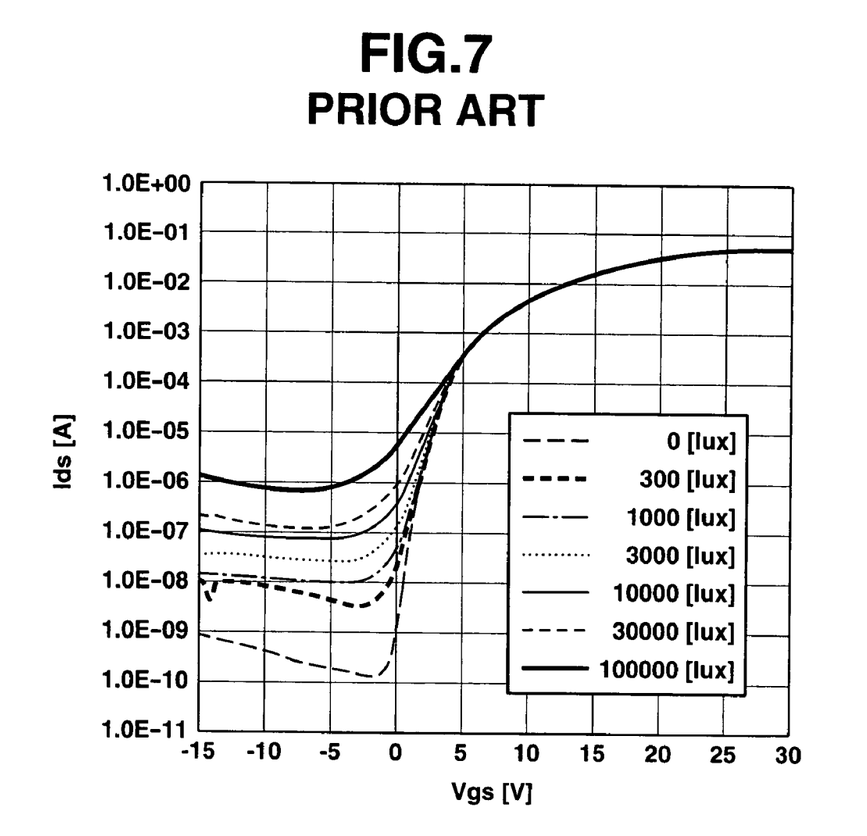
FIG. 7 is a diagram showing the light-electricity characteristics of an a-Si TFT.

FIG. 7 is a diagram showing one example of the light-electricity characteristics of an a-Si TFT used in such a photosensor (Ids [A] is measured when the illumination of irradiated light is used as a parameter under conditions such that TFT size (W/L)=180000/9 μm, and terminal voltages Vs=0 V and Vd=10 V). FIG. 7 shows that the drain-source current Ids increases with illumination. The Ids prominently increases especially in a reverse bias region (Vgs<0), and the photosensor generally uses the characteristic of this region to detect the illumination of the irradiated light as the change of the Ids.

Such a photosensor (light detector) is used to detect the presence of, for example, a pachinko ball (pinball) or paper as a detection target (e.g., Jpn. Pat. Appln. KOKAI Publication No. 2002-148353).

However, in such an application, there is a high possibility of disturbance light entering the light receiving element in addition to light radiated from a light source and reflected by the detection target. If the disturbance light enters the light receiving element, an erroneous operation may be caused due to decreased accuracy in the detection of the detection target.

Thus, Jpn. Pat. Appln. KOKAI Publication No. 2002-148353 has proposed a detection method in which the light emission timing of a light emitting element for emitting light to be applied to a detection target is compared with the light receiving timing of a light receiving element, and in which it is recognized whether light reflected from the detection target or outside light has been received in accordance with whether these timings are synchronized with each other.

However, the detection method disclosed in Jpn. Pat. Appln. KOKAI Publication No. 2002-148353 is not capable of providing an inexpensive photosensor free of erroneous operations due to a complicated detection circuit, the necessity of strict timing control, etc.

BRIEF SUMMARY OF THE INVENTION

The present invention has been made in view of the foregoing, and an object of the present invention is to provide a photosensor which requires no complicated detection circuit and no strict timing control, as well as to provide a target detection method of the photosensor, and a display panel equipped with the photosensor.

According to one aspect of the invention, a photosensor includes: first and second light receiving elements which detect light; a light source which is disposed behind the first and second light receiving elements and which emits light containing a predetermined color component; a first filter which is disposed in front of the first light receiving element and which transmits light of the predetermined color component; a second filter which is disposed in front of the second light receiving element and which shuts off the light of the predetermined color component and transmits a color component other than the predetermined color component; and judging means for judging whether or not a detection target is present in front of the first and second filters based on outputs from the first and second light receiving elements.

According to another aspect of the present invention, a method is provided for controlling the photosensor panel to judge whether or not the detection target is present.

According to a further aspect of the present invention, a display panel is provided which includes the photosensor. The photosensor may be provided as an operating switch to control a display element of the display panel.

According to the present invention, it is possible to provide a photosensor which requires no complicated detection circuit and no strict timing control, a target detection method of the photosensor, and a display panel equipped with the photosensor.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE DRAWINGS

The accompanying drawings, which are incorporated in and constitute a part of the specification, illustrate embodiments of the invention, and together with the general description given above and the detailed description of the embodiments given below, serve to explain the principles of the invention.

DETAILED DESCRIPTION

A best mode of carrying out the present invention will hereinafter be described with reference to the drawings.

First Embodiment

Figure 1A:
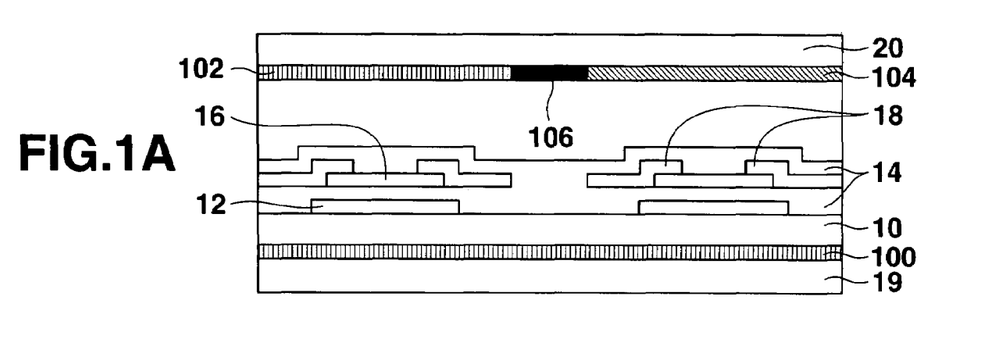
FIG. 1A is a diagram showing an example of the configuration of a photosensor according to a first embodiment of the present invention.

FIG. 1A is a diagram showing an example of the configuration of a photosensor according to a first embodiment of the present invention. For simplicity, only two a-Si TFTs are shown as light receiving elements in the photosensor in FIG. 1A.

The a-Si TFT as the light receiving element includes a gate electrode 12 formed on a transparent TFT substrate 10, a transparent insulating film 14 formed on the gate electrode 12, an a-Si part 16 formed opposite to the gate electrode 12 on the insulating film 14, and source and drain electrodes 18 formed on the a-Si part 16. In addition, the transparent insulating film 14 is formed on the upper side (front side) of the a-Si TFT.

Moreover, a transparent opposite substrate 20 is provided on the upper side (front side) of the insulating film 14 as shown in FIG. 1A so that a predetermined distance between the insulating film 14 and the transparent opposite substrate 20 is secured by a seal member and a gap member (not shown). The predetermined distance is decided in accordance with the space between the adjacently disposed a-Si TFTs and in accordance with the refractive indices of the members constituting the photosensor. That is, the predetermined distance is decided so that the a-Si part 16 of each of the a-Si TFTs can correctly receive reflected light 26, which is a backlight ray that is radiated from a white backlight 19 disposed on the back side of the TFT substrate 10 to the side of the opposite substrate 20 through a space between the adjacent a-Si TFTs and which is reflected by a detection target such as a finger 24 placed on the opposite substrate 20.

The predetermined distance between the insulating film 14 and the transparent opposite substrate 20 may be filled with air as a space, or liquid crystal may be filled therein when the photosensors are formed so that they are integrally incorporated in a TFT-LCD panel as described later.

In the photosensor according to the present embodiment, a color filter for transmitting light of a particular wavelength region, here a red color filter (hereinafter referred to as a TFT R filter) 100 for transmitting light of a red wavelength is formed on the lower surface (white backlight side) of the transparent TFT substrate 10. Below, the "particular wavelength region" refers to the red wavelength region, or the red light that is transmitted by the TFT R filter 100. In addition, on the lower surface (a-Si TFT side) of the transparent opposite substrate 20, a red color filter (hereinafter referred to as an opposite R filter) 102 for transmitting light of a red wavelength (i.e., light in the particular wavelength region), and a color filter for shutting off the light of the particular wavelength region, here, a green color filter (hereinafter referred to as an opposite G filter) 104 for transmitting light of a green wavelength, are formed. The opposite R filter 102 is formed opposite to one of the adjacently arranged a-Si TFTs, and the opposite G filter 104 is formed opposite to the other of the adjacently arranged a-Si TFTs. Moreover, a black mask 106 made of a light absorbing material such as a resin or Cr oxide is formed between the opposite R filter 102 and the opposite G filter 104. The color filters 100, 102 and 104, as well as the black mask 106, are formed by a semiconductor process.

Thus, the photosensor according to the present embodiment includes at least two a-Si TFTs as first and second light receiving elements for light detection, the TFT R filter 100 which is disposed on the back sides of the two a-Si TFTs and which only allows a red backlight ray as a predetermined color component to exit from the back sides to front sides of the light receiving elements, the opposite R filter 102 which is disposed on the front side of one of the two a-Si TFTs and which only transmits red light, and the opposite G filter 104 which is disposed on the front side of the other of the two a-Si TFTs and which shuts off the red light and transmits green light. Further, the two a-Si TFTs are adjacently arranged with a predetermined space in between them so that the light from the backlight can pass therebetween. In addition, a light source is constituted by the white backlight 19 and the TFT R filter 100.

Figure 1B:
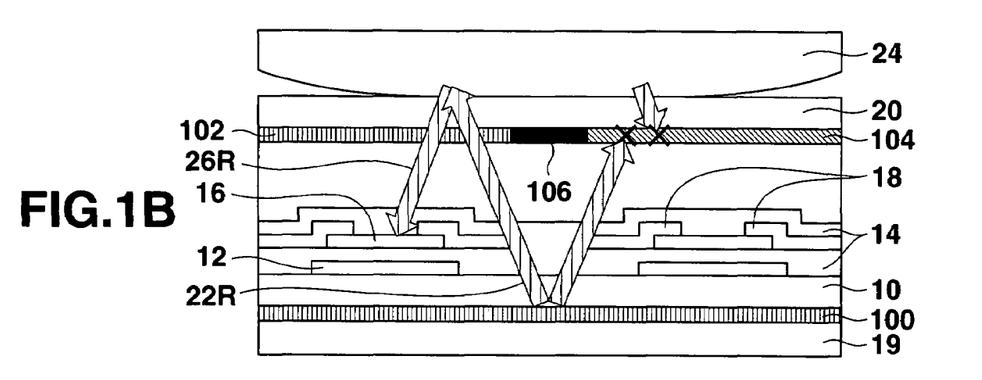
FIG. 1B is a diagram for explaining the path of light when a detection target contacts an opposite substrate.
Figure 1C:
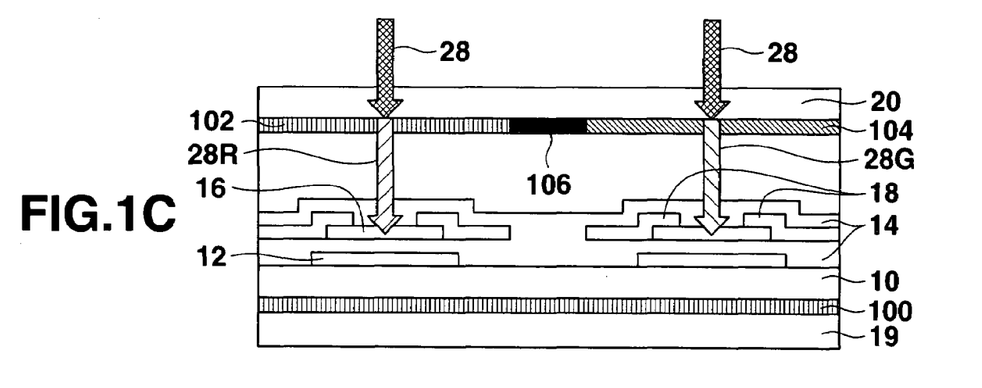
FIG. 1C is a diagram for explaining the path of light when strong outside light has entered the photosensor.
Figure 2:
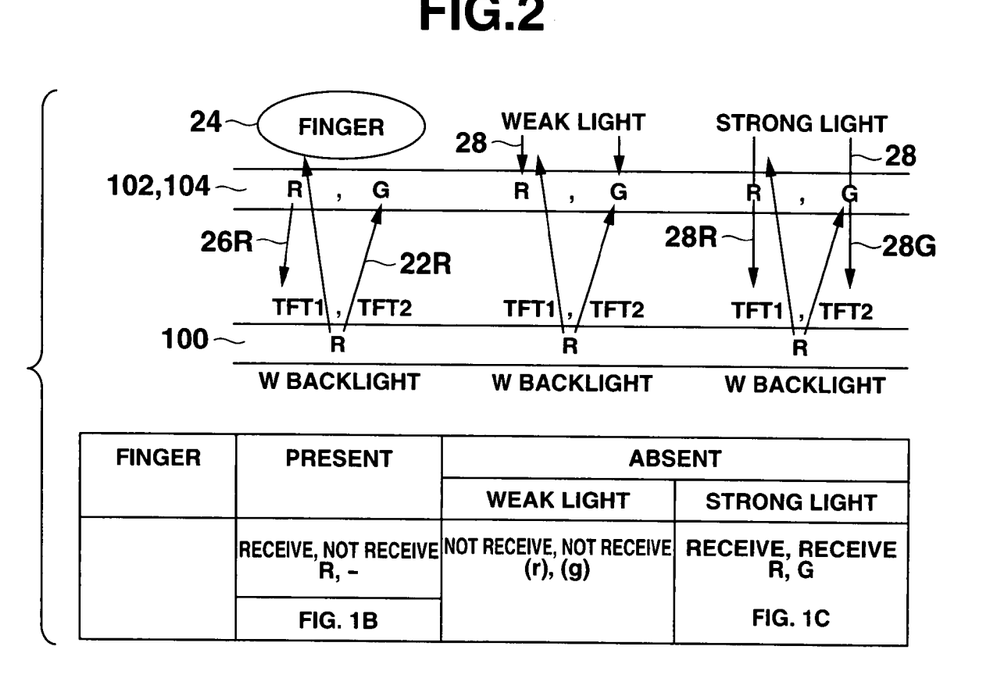
FIG. 2 is a schematic diagram for explaining the operation of the photosensor according to the first embodiment.

Next, the operation of the photosensor having such a configuration will be described with reference to FIG. 1B, FIG. 1C and FIG. 2. FIG. 1B is a diagram for explaining the path of the backlight ray when the finger 24 as a detection target contacts the opposite substrate 20, and FIG. 1C is a diagram for explaining the path of light when strong outside light 28 has entered. Moreover, FIG. 2 is a schematic diagram for explaining the operation of the photosensor of the present embodiment.

In the present embodiment, as shown in FIG. 1B, a red component 22R alone is selected by the TFT R filter 100 from the backlight ray generated from the white backlight 19, and the backlight ray then passes between the adjacent a-Si TFTs and is radiated toward the opposite substrate 20.

In a region where the opposite R filter 102 is formed, the red component 22R of the backlight ray penetrates through the opposite substrate 20 and the opposite R filter 102, and exits to the outside of the photosensor. Then, the backlight ray is reflected by the finger 24 as the detection target contacting the top of the opposite substrate 20, and the reflected backlight ray is returned into the photosensor as red reflected light 26R. This red reflected light 26R penetrates through the opposite substrate 20 and the opposite R filter 102, and is applied to the a-Si TFT disposed under the opposite R filter 102.

On the other hand, in a region where the opposite G filter 104 is formed, the red component 22R of the backlight ray is absorbed or diffusely reflected by the opposite G filter 104 so that it is mostly shut off without exiting to the outside of the photosensor. Then, even if a portion of the red component 22R of the backlight ray which has slightly exited to the outside through the opposite G filter 104 is reflected by the finger 24, thereby obtaining red reflected light 26R, most of the red reflected light 26R is shut off by the opposite G filter 104. See FIG. 1B. Consequently, almost no red light is applied to the a-Si TFT disposed under the opposite G filter 104.

Therefore, when the finger 24 is in contact with the photosensor (when the detection target covers the front sides of the opposite R filter 102 and the opposite G filter 104), a situation arises where the a-Si TFT (TFT 1) under the opposite R filter 102 receives light reflected from the detection target while the a-Si TFT (TFT 2) under the opposite G filter 104 does not receive the light reflected from the detection target, as shown in the left portion of FIG. 2. That is, a situation arises where the a-Si TFT (TFT 1) corresponding to the opposite R filter 102 receives light having an intensity equal to or more than a predetermined first threshold value while the a-Si TFT (TFT 2) corresponding to the opposite G filter 104 receives light having an intensity below a predetermined second threshold value. In the present embodiment, this situation is referred to as the photosensor being on (a condition where the detection target is present).

On the other hand, when the outside light 28 such as sunlight having a luminance higher than that of the backlight ray is applied to the photosensor as shown in FIG. 1C, the a-Si TFT under the opposite R filter 102 receives a red component 28R of the outside light, and the a-Si TFT under the G filter receives a green component 28G of the outside light. That is, as shown in the right portion of FIG. 2, a situation arises where the adjacent a-Si TFTs receive light having an intensity equal to or more than the predetermined first threshold value or the predetermined second threshold value. In the present embodiment, this situation is referred to as the photosensor being off (a condition where the detection target is absent).

In the present embodiment, a situation where the luminance of the outside light 28 is low and both of the adjacent a-Si TFTs receive no light as shown in the center of FIG. 2 is also referred to as the photosensor being off (a condition where the detection target is absent). That is, the present embodiment also refers to a situation where the adjacent a-Si TFTs receive light having an intensity below the predetermined first threshold value or the predetermined second threshold value as the photosensor being off (a condition where the detection target is absent).

The principle described above makes it possible to provide a mechanism in which only a condition where the finger 24 is in contact with the photosensor is recognized as being an "on" condition of the photosensor (a condition where the detection target is present) while other conditions are recognized as being an "off" condition of the photosensor (a condition where the detection target is absent).

In the present embodiment, light emitting means for emitting light of a particular wavelength region is constituted by the white backlight 19 as a white light source disposed on the lower side of the transparent TFT substrate 10 and the red color filter (TFT R filter) 100 as a third filter for selecting a predetermined color component from the white light emitted from the white backlight and transmitting the predetermined color component.

Furthermore, irradiating light selecting means for selectively transmitting the light emitted from the light emitting means to a detection target is constituted by the red color filter (opposite R filter) 102 as a first filter which transmits the light emitted from the light emitting means, and the green color filter (opposite G filter) 104 as a second filter which has a transparent wavelength region different from the particular wavelength region and which does not transmit the light emitted from the light emitting means.

Moreover, a light receiving element array is constituted by a plurality of light receiving elements including the a-Si TFT (TFT 1) disposed under the opposite R filter 102 as a first light receiving element for receiving light transmitted through the first filter and the a-Si TFT (TFT 2) disposed under the opposite G filter 104 as a second light receiving element for receiving light transmitted through the second filter. Thus, a photosensor is provided which judges by unshown judging means whether the detection target is present as described above in accordance with the output from the light receiving element array.

As described above, according to the present embodiment, only the condition where the finger 24 is in contact with the photosensor is recognized as the photosensor being on (a condition where the detection target is present), while the case of strong disturbance light and the case of no disturbance or reflected light are recognized as the photosensor being off, whereby the photosensor of the first embodiment is able to avoid incorrectly detecting the presence of the detection object.

Figure 3:
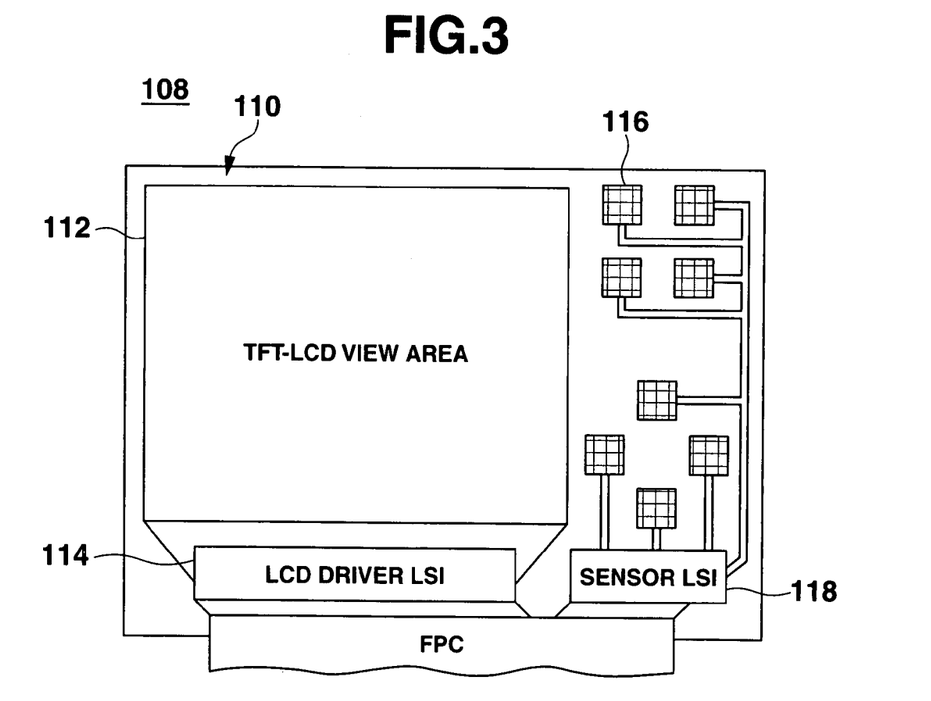
FIG. 3 is a diagram showing a TFT-LCD panel integrally incorporating a plurality of photosensors according to the first embodiment.

FIG. 3 is a diagram showing an example in which a plurality of photosensors are formed to be integrally incorporated into a TFT-LCD panel as a display element for indicating information. In this case, the photosensors function as operating switches for controlling the state of the TFT-LCD panel. That is, the photosensors function as, for example, an operating switch(es) for switching on or off the power of the TFT-LCD panel and an operating switch(es) for switching indicated contents displayed on the TFT-LCD panel.

Figure 4:
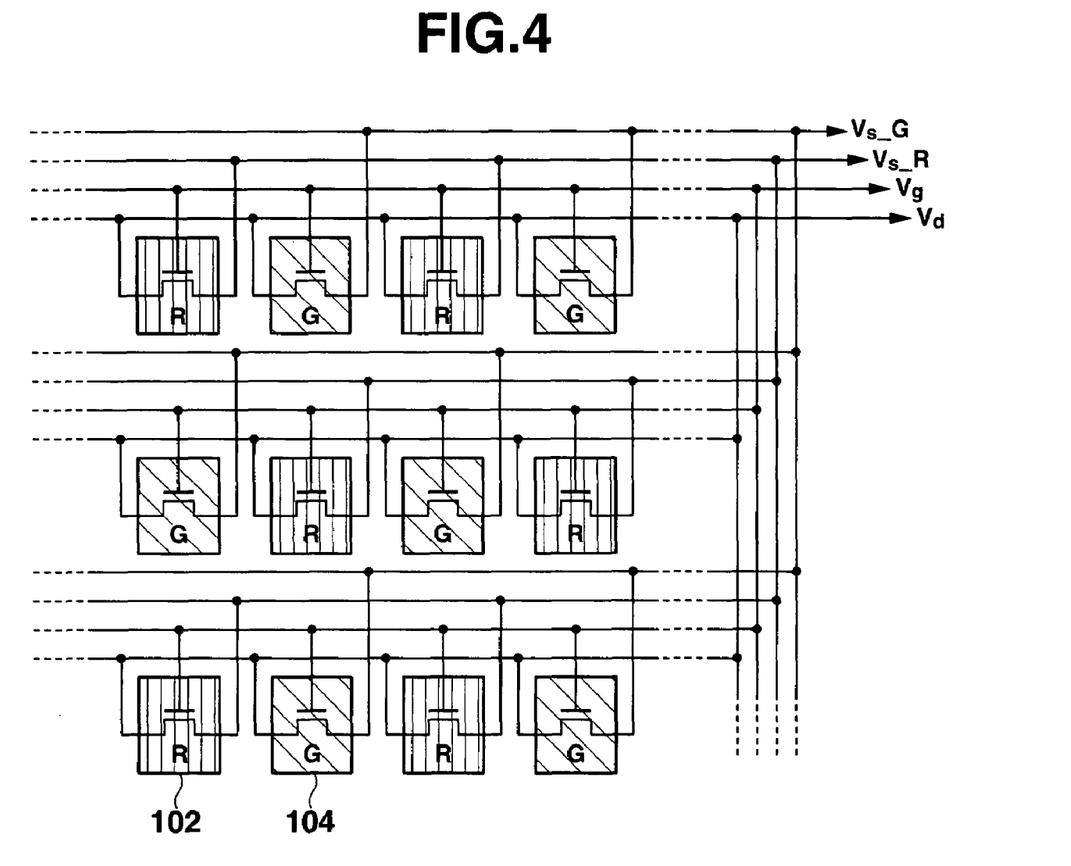
FIG. 4 is a diagram showing the electrical connection and configuration of the TFTs of a photosensor.
Figure 5:
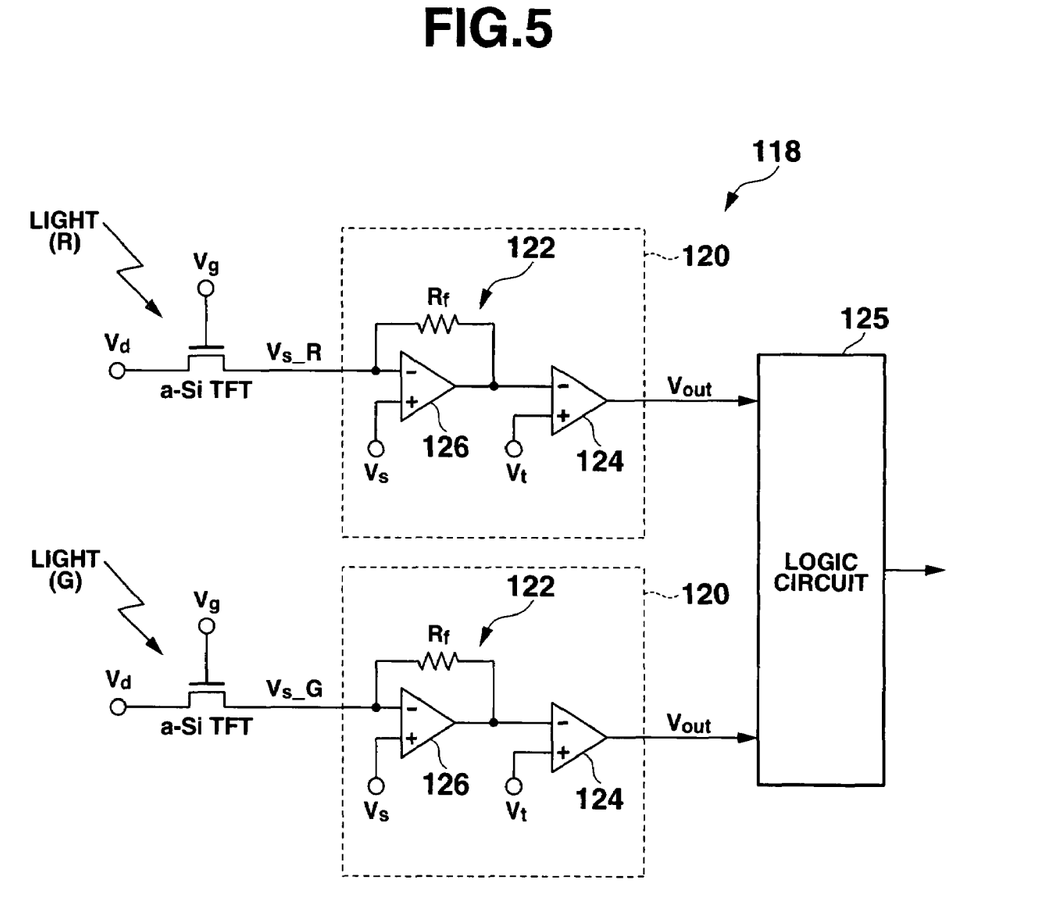
FIG. 5 is a diagram of a detection circuit built in a sensor LSI.

Furthermore, FIG. 4 is a diagram showing the electrical connection and configuration of the a-Si TFTs, and FIG. 5 is a diagram of a detection circuit built in a sensor LSI.

A TFT-LCD panel 108 has a TFT-LCD 112 and an LCD drive LSI 114 which are formed on a glass (or plastic) substrate 110 by a semiconductor process, and a plurality of photosensors 116 and a sensor LSI 118 can be formed on the same substrate 110 as shown in FIG. 3.

In this case, the TFT substrate 10 of each photosensor 116 corresponds to the substrate 110, and the opposite R filter 102 and the opposite G filter 104 (as well as the black mask 106) can be formed by the same member and process as that of the TFT-LCD 112. Therefore, in terms of process steps, only the formation of the TFT R filter 100 is added. The TFT R filter 100 is formed in a region corresponding to the photosensors 116 but is not formed in a region corresponding to the TFT-LCD 112. This permits the backlight of the TFT-LCD 112 to be used as the white backlight 19 for the photosensors.

Each photosensor 116 is formed by a plurality of a-Si TFTs that are adjacently arranged vertically and horizontally in a two-dimensional form. In this case, as shown in FIG. 4, the opposite R filters 102 and the opposite G filters 104 are formed so that they are alternately arranged vertically and horizontally. The gate electrode 12, the source and drain electrodes 18 and interconnects are formed so that the a-Si TFTs under the opposite R filters 102 are connected in parallel to each other and so that the a-Si TFTs under the opposite G filters 104 are connected in parallel to each other. That is, each a-Si TFT under an opposite R filter 102 is formed so that its gate electrode 12 is connected to one interconnect Vg, its drain electrode is connected to one interconnect Vd and its source electrode is connected to one interconnect Vs_R. In the same manner, each a-Si TFT under an opposite G filter 104 is formed so that its gate electrode 12 is connected to one interconnect Vg (in common with the gate electrodes of the a-Si TFTs under the opposite R filters 102), its drain electrode is connected to one interconnect Vd (in common with the drain electrodes of the a-Si TFTs under the opposite R filters 102) and its source electrode is connected to one interconnect Vs_G.

The interconnects Vg, Vd, Vs_R and Vs_G are connected to the sensor LSI 118. Detection circuits 120 as shown in FIG. 5 are formed in the sensor LSI 118. Here, in the sensor LSI 118, two detection circuits 120 of the same configuration are formed, one for the a-Si TFTs under the opposite R filters 102 connected in parallel and one for the a-Si TFTs under the opposite G filters 104 connected in parallel. It is to be noted that the plurality of a-Si TFTs connected in parallel to each other are equivalently indicated as one a-Si TFT in a collective manner in FIG. 5. That is, the composition of outputs of the plurality of a-Si TFTs connected in parallel is input to the detection circuit 120.

The detection circuit 120 is constituted by a current-voltage conversion circuit 122 and a comparator 124. Here, the current-voltage conversion circuit 122 includes an inverting amplifier 126 in which a predetermined voltage $V_s$ is applied to its noninverting input terminal, and a feedback resistor Rf is connected between an output terminal and an inverting input terminal of the inverting amplifier 126, and the current-voltage conversion circuit 122 is formed so that the interconnect Vs_R or Vs_G from the a-Si TFT is connected to the inverting input terminal of the inverting amplifier 126. The comparator 124 compares a voltage value converted in the current-voltage conversion circuit 122 with a predetermined threshold voltage value $V_t$, and outputs an output signal Vout indicating whether the TFT is in a receiving state or a non-receiving state.

A logic circuit 125 is further formed in the sensor LSI 118 to perform logic operations for the output signals Vout of the two detection circuits 120. As described with reference to FIG. 2, the photosensor 116 is recognized to be on when the output signal on the side of the a-Si TFT under the opposite R filter 102 is detected to be "1" and the output signal on the side of the a-Si TFT under the opposite G filter 104 is "0". Likewise, the photosensor 116 is recognized to be off when the output signal on the side of the a-Si TFT under the opposite R filter 102 is detected to be "1" and the output signal on the side of the a-Si TFT under the opposite G filter 104 is "1" and when the output signal on the side of the a-Si TFT under the opposite R filter 102 is detected to be "0" and the output signal on the side of the a-Si TFT under the opposite G filter 104 is "0".

Thus, in one photosensor 116, a plurality of a-Si TFTs are adjacently arranged, and the a-Si TFTs under the same color filter are connected in parallel to form a composite output by which the photosensor is judged to be on or off, such that the photosensor can be accurately judged to be on or off even with a small number of detection circuits. When the output signal on the side of the a-Si TFT under the opposite R filter 102 is detected to be "0" and the output signal on the side of the a-Si TFT under the opposite G filter 104 is "1", something may be wrong with the photosensor 116. In this case, the occurrence of an error is checked and the results of the check are preferably notified without having to determine whether the photosensor 116 is on or off.

As described above, according to the photosensor in the first embodiment of the present invention, the opposite R filters 102 and the opposite G filters 104 are disposed above the adjacent a-Si TFTs, and a mechanism is provided wherein the red component 22R of the backlight ray alone is detected by one of the a-Si TFTs to recognize the contact of the finger 24, thereby providing an advantage that erroneous operations due to the outside light 28 (mainly sunlight) can be prevented.

Furthermore, in such a photosensor, components other than the TFT R filter 100 can be constructed using the same members as those of the TFT-LCD 112, so that there is an advantage that the photosensors can be formed integrally with the TFT-LCD 112 (the TFT-LCD panel 108 with the photosensors can be manufactured without increasing the number of process steps, except to add the TFT R filter).

There is also an advantage that the backlight as part of the light emitting means of the photosensor can be used in common with the indication on the LCD.

In addition, in order for the photosensors as described above to function as the operating switches of the TFT-LCD panel 108 as the display element, a controller (e.g., a CPU) is preferably provided to control the display element on the basis of the timing with which the photosensors switches are judged to turn from off to on or on to off.

Second Embodiment

Figure 6:
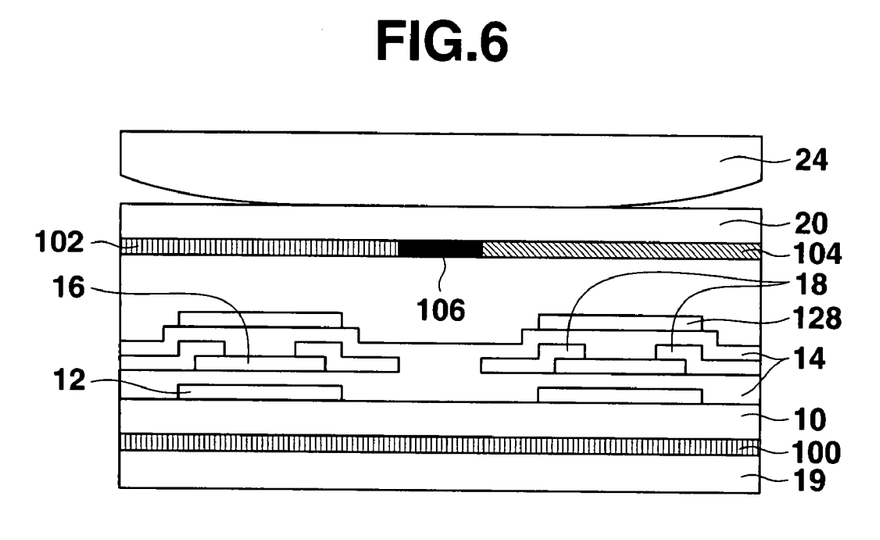
FIG. 6 is a diagram showing an example of the configuration of a photosensor according to a second embodiment of the present invention.

FIG. 6 is a diagram showing an example of the configuration of a photosensor according to a second embodiment of the present invention. In the description of the photosensor according to the second embodiment, the same reference numbers are assigned to parts similar to those in the photosensor according to the first embodiment, and these parts are not described. Moreover, for simplicity, only two a-Si TFTs alone are shown.

In the photosensor according to the present second embodiment, a double-gate a-Si TFT is employed instead of the a-Si TFT in the first embodiment.

That is, each of the double-gate a-Si TFTs includes a gate electrode 12 formed on a transparent TFT substrate 10, a transparent insulating film 14 formed on the gate electrode 12, an a-Si part 16 formed opposite to the gate electrode 12 on the insulating film 14, source and drain electrodes 18 formed on the a-Si part 16, and a transparent top gate electrode 128 provided on the insulating film 14 and covering the tops of the a-Si part 16 and the source and drain electrodes 18 (i.e., provided at a position corresponding to the a-Si part 16 and the source and drain electrodes 18).

According to the photosensor using such double-gate a-Si TFTs, effects similar to those in the first embodiment can be obtained, and the control timings of two gates can be staggered to control sensitivity characteristics, such that the ratio between light and dark outputs can be high.

While the present invention has been described in connection with the embodiments, the present invention is not limited to the embodiments described above, and various modifications and applications can be made without departing from the spirit of the present invention.

For example, the red and green color filters are formed under the opposite substrate 20 in the embodiments described above, but color filters of other colors may be formed. In that case, it will be appreciated that one of the colors of the color filters provided instead of the red and green color filters is the same as the color of the color filter under the TFT substrate 10 (which may be a color other than red). Moreover, the kinds of colors are not limited to two, and more colors may be used. In that case, the color filter under the TFT substrate 10 has to be divided into regions to form a plurality of colors so that a plurality of kinds of monochromatic rays can be radiated.

Furthermore, the color filters are disposed under the opposite substrate 20 in the embodiments described above, but they may be disposed on the top of the opposite substrate 20 or on the top of the transparent insulating film 14 covering the a-Si part 16.

Still further, the white backlight and the red color filter under the TFT substrate 10 are used as the light emitting means for emitting light of a particular wavelength region to generate the monochromatic ray of the red component 22R in the embodiments described above, but a light source such as an LED or OLED capable of irradiating a monochromatic ray may be used instead of providing such a color filter.

Still further, the a-Si TFTs are connected in parallel to provide one detection circuit 120 (FIG. 5) for each color in the embodiments described above, but one detection circuit 120 may be provided for each a-Si TFT so that the each a-Si TFT is individually judged to be on or off and with this structure the results of the judgments regarding all the a-Si TFTs constituting one photosensor 116 are totaled to make a final judgment on whether the photosensor 116 is on or off. It should further be understood that the detection circuit is not limited to the configuration shown in FIG. 5.

Still further, while the case of the double-gate type a-Si TFT has been above described in the second embodiment, it is also possible to employ a multi-gate a-Si TFT having more gate electrodes.

Still further, not only the a-Si TFT but also other TFTs such as a polysilicon TFT may be used as the light receiving element.

Further yet, the present invention is not limited to the transistors such as the TFT, and other light receiving elements such as a photodiode may be used.

Additional advantages and modifications will readily occur to those skilled in the art. Therefore, the invention in its broader aspects is not limited to the specific details, representative devices, and illustrated examples shown and described herein.

Accordingly, various modifications may be made without departing from the spirit or scope of the general inventive concept as defined by the appended claims and their equivalents.

What is claimed is:

1. A photosensor comprising:
a first light receiving element and a second light receiving element which detect light intensity;
a first filter which is disposed in front of the first light receiving element and which transmits light of a predetermined color component and shuts off other color components which are different from the predetermined color component;
a second filter which is disposed in front of the second light receiving element and which shuts off the light of the predetermined color component and transmits the color component other than the predetermined color component;
a light source which is disposed behind the first and second light receiving elements and which emits light including the predetermined color component and not including the color component other than the predetermined color component; and
a judging unit for judging whether or not a detection target is present in front of the first and second filters based on a transmission light intensity of the first filter which is detected by the first light receiving element and a transmission light intensity of the second filter which is detected by the second light receiving element when the light is emitted from the light source.

2. The photosensor according to claim 1, wherein the first and second light receiving elements are adjacently arranged with a predetermined space there between so that the light from the light source passes between the first and second light receiving elements.

3. The photosensor according to claim 1, wherein the light source includes a third filter which only transmits the light of the predetermined color component.

4. The photosensor according to claim 1, wherein the judging unit:
judges that the detection target is present in front of the first and second filters when an intensity of light detected by the first light receiving element is equal to or greater than a predetermined first threshold value and an intensity of light detected by the second light receiving element is below a predetermined second threshold value, and
judges that the detection target is not present in front of the first and second filters when one of: (i) the intensity of light detected by the first light receiving element is equal to or greater than the first threshold value and the intensity of light detected by the second light receiving element is equal to or greater than the second threshold value and (ii) when the intensity of light detected by the first light receiving element is below the first threshold value and the intensity of light detected by the second light receiving element is below the second threshold value.

5. A photosensor comprising:
a first light receiving element and a second light receiving element which detect light intensity;
a first filter which is disposed in front of the first light receiving element and which transmits light of a particular wavelength region and shuts off other wavelength regions which are different from the particular wavelength region;
a second filter which is disposed in front of the second light receiving element and which shuts off the light of the particular wavelength region and transmits the wavelength region other than the particular wavelength region;
a light source which is disposed behind the first and second light receiving elements and which emits light including the particular wavelength region and not including the wavelength region other than the particular wavelength region; and
a judging unit for judging whether or not a detection target is present in front of the first and second filters based on a transmission light intensity of the first filter which is detected by the first light receiving element and a transmission light intensity of the second filter which is detected by the second light receiving element when the light is emitted from the light source.

6. The photosensor according to claim 5, wherein
the judging unit judges that the detection target is present in front of the first and second filters when an intensity of light detected by the first light receiving element is equal to or greater than a predetermined first threshold value and an intensity of light detected by the second light receiving element is below a predetermined second threshold value.

7. The photosensor according to claim 5, wherein
the judging unit judges that the detection target is absent in front of the first and second filters when the intensity of light detected by the first light receiving element is below a predetermined first threshold value and the intensity of light detected by the second light receiving element is below a predetermined second threshold value.

8. The photosensor according to claim 5, wherein the judging unit judges that the detection target is absent when a predetermined output is not obtained from either the first or second light receiving element of the light receiving element array.

9. The photosensor according to claim 5, wherein each said light receiving element comprises an amorphous silicon thin-film transistor.

10. The photosensor according to claim 5, wherein each said light receiving element comprises a double-gate amorphous silicon thin-film transistor.

11. A target detection method for a photosensor, the photosensor comprising: a first light receiving element and a second light receiving element which detect light intensity; a first filter which is disposed in front of the first light receiving element and which transmits light of a particular wavelength region and shuts off other wavelength regions which are different from the particular wavelength region; and a second filter which is disposed in front of the second light receiving element and which shuts off the light of the particular wavelength region and transmits the wavelength region other than the particular wavelength region, said method comprising:

emitting light including the particular wavelength region and not including the wavelength region other than the particular wavelength region from behind the first and second light receiving elements to the front of the first and second filters;

detecting light intensity of light transmitting through the first filter by the first light receiving element and detecting intensity of light transmitting through the second filter by the second light receiving element while light is emitted,; and judging whether or not a detection target is present in front of the first and second filters, based on the light intensity transmitting through the first filter and light intensity transmitting through the second filter detected by obtaining the light intensity.

12. The method according to claim 11, wherein the judging includes judging that the detection target is present in front of the first and second filters when an intensity of light detected by the first light receiving element is equal to or greater than a predetermined first threshold value and an intensity of light detected by the second light receiving element is below a predetermined second threshold value.

13. The method according to claim 11, wherein the judging includes judging that the detection target is absent in front of the first and second filters when the intensity of light detected by the first light receiving element is equal to or greater than a predetermined first threshold value and the intensity of light detected by the second light receiving element is equal to or greater than a predetermined second threshold value.

14. The method according to claim 11, wherein the judging includes judging that the detection target is absent in front of the first and second filters when the intensity of light detected by the first light receiving element is below a predetermined first threshold value and the intensity of light detected by the second light receiving element is below a predetermined second threshold value.

15. A display panel comprising:

a first light receiving element and a second light receiving element which detect light intensity;

a first filter which is disposed in front of the first light receiving element and which transmits light of a particular wavelength region and shuts off other wavelength regions which are different from the particular wavelength region;

a second filter which is disposed in front of the second light receiving element and which shuts off the light of the particular wavelength region and transmits the wavelength region other than the particular wavelength region;

a light source which is disposed behind the first and second light receiving elements and which emits light including the particular wavelength region and not including the wavelength region other than the particular wavelength region;

a judging unit for judging whether or not a detection target is present in front of the first and second filters based on a transmission light intensity of the first filter which is detected by the first light receiving element and a transmission light intensity of the second filter which is detected by the second light receiving element upon emitting the light from the light source; and a display element.

16. The display panel according to claim 15, wherein the display element is controlled so that power to the display panel is turned on or off based on the result of the judgment by the judging unit.

17. The display panel according to claim 15, wherein the light receiving element is formed on a substrate of the display element.

18. A display panel comprising:

a display element which indicates information; and an operating switch which controls a state of the display element, wherein the operating switch comprises:

first and second light receiving elements which detect light intensity;

a first filter which is disposed in front of the first light receiving element and which transmits light of a predetermined color component and shuts off other color components which are different from the predetermined color component;

a second filter which is disposed in front of the second light receiving element and which shuts off the light of the predetermined color component and transmits the color components other than the predetermined color components;

a light source which is disposed behind the first and second light receiving elements and which emits light including the predetermined color component and not including the color component other than the predetermined color component; and a judging unit for judging whether or not a detection target is present in front of the first and second filters in based on a transmission light intensity of the first filter which is detected by the first light receiving element and a transmission light intensity of the second filter which is detected by the second light receiving element upon emitting the light from the light source.

19. The display panel according to claim 18, wherein the first and second light receiving elements are adjacently arranged with a predetermined space therebetween so that the light from the light source passes between the first and second light receiving elements.

20. The display panel according to claim 18, wherein the light source includes a third filter which only transmits the light of the predetermined color component.

21. The display panel according to claim 18, wherein the judging unit:

judges that the detection target is present in front of the first and second filters when an intensity of light detected by the first light receiving element is equal to or greater than a predetermined first threshold value and an intensity of light detected by the second light receiving element is below a predetermined second threshold value, and judges that the detection target is not present in front of the first and second filters when one of: (i) the intensity of light detected by the first light receiving element is equal to or greater than the first threshold value and the intensity of light detected by the second light receiving element is equal to or greater than the second threshold value and (ii) when the intensity of light detected by the first light receiving element is below the first threshold value and the intensity of light detected by the second light receiving element is below the second threshold value.

22. The photosensor according to claim 3, wherein the first filter and the third filter transmit light of a red component, and the second filter transmits light of a green component.

23. The display panel according to claim 18, wherein the light source comprises a third filter which transmits only light of the predetermined color component, the third filter being formed in a region corresponding to the light receiving element so as to avoid a region corresponding to the display element.

* * * * *